(12) United States Patent
Gavillet

(10) Patent No.: US 9,291,406 B2
(45) Date of Patent: Mar. 22, 2016

(54) HEAT-ABSORBING DEVICE WITH PHASE-CHANGE MATERIAL

(75) Inventor: Jerome Gavillet, Saint Egreve (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 249 days.

(21) Appl. No.: 13/984,955

(22) PCT Filed: Feb. 9, 2012

(86) PCT No.: PCT/EP2012/052219
§ 371 (c)(1),
(2), (4) Date: Aug. 12, 2013

(87) PCT Pub. No.: WO2012/107523
PCT Pub. Date: Aug. 16, 2012

(65) Prior Publication Data
US 2013/0312935 A1    Nov. 28, 2013

(30) Foreign Application Priority Data
Feb. 11, 2011 (FR) ..................... 11 51147

(51) Int. Cl.
*H01L 23/427*   (2006.01)
*F28F 7/00*     (2006.01)
(Continued)

(52) U.S. Cl.
CPC . *F28F 7/00* (2013.01); *B23P 15/26* (2013.01); *F28D 20/021* (2013.01); *F28D 20/023* (2013.01); *H01L 23/427* (2013.01);
(Continued)

(58) Field of Classification Search
CPC .......... F28F 7/00; B23P 15/26; F28D 20/023; F28D 20/021; H01L 23/427; H01L 2924/0002; Y10T 29/4935; Y02E 60/145
See application file for complete search history.

(56) References Cited

U.S. PATENT DOCUMENTS

| 4,405,010 A | 9/1983 | Schwartz |
| 4,625,710 A | 12/1986 | Harada et al. |
| 2007/0009687 A1 | 1/2007 | Edwards et al. |

(Continued)

FOREIGN PATENT DOCUMENTS

| CN | 1546927 A | 11/2004 |
| CN | 201181093 Y | 1/2009 |

(Continued)

OTHER PUBLICATIONS

U.S. Appl. No. 14/128,266, Feb. 25, 2014, Dellea, et al.
(Continued)

*Primary Examiner* — Sarang Afzali
*Assistant Examiner* — Ruth G Hidalgo-Hernandez
(74) *Attorney, Agent, or Firm* — Oblon, McClelland, Maier & Neustadt, L.L.P.

(57) ABSTRACT

A heat absorbing device including a structure including plural individual cells delimited by an envelope made of a material that has good thermal conductivity and includes at least one phase-change material, the cells being stacked on top of one another from an end surface so that the structure extends in a direction of thermal flux, the flux being made up of two notable periodic thermal events, the structure including two different sizes of cells. The sizes of the cells are determined as a function of frequency of the thermal events of the thermal flux and a distribution of a number of cells of each size is determined as a function of amplitudes of each event.

19 Claims, 6 Drawing Sheets

(51) Int. Cl.
  *F28D 20/02* (2006.01)
  *B23P 15/26* (2006.01)

(52) U.S. Cl.
  CPC ....... *H01L2924/0002* (2013.01); *Y02E 60/145* (2013.01); *Y10T 29/4935* (2015.01)

(56) References Cited

U.S. PATENT DOCUMENTS

| | | |
|---|---|---|
| 2008/0030960 A1 | 2/2008 | Edwards et al. |
| 2010/0051227 A1 | 3/2010 | Anbudurai |
| 2011/0198059 A1 | 8/2011 | Gavillet et al. |
| 2012/0067558 A1 | 3/2012 | Phan et al. |
| 2012/0168131 A1 | 7/2012 | Gavillet et al. |
| 2012/0180978 A1 | 7/2012 | Gavillet et al. |
| 2013/0098417 A1 | 4/2013 | Gavillet |
| 2014/0369005 A1 | 12/2014 | Gavillet et al. |

FOREIGN PATENT DOCUMENTS

| | | |
|---|---|---|
| EP | 0 165 596 | 12/1985 |
| EP | 1 195 571 A2 | 4/2002 |
| JP | 11-264683 A | 9/1999 |
| WO | 96 28846 | 9/1996 |
| WO | WO 2005/057119 A1 | 6/2005 |

OTHER PUBLICATIONS

French Preliminary Search Report issued Nov. 16, 2011 in Patent Application No. 1151147 (with English translation of categories of cited documents).

M.J. Huang, et al., "Phase change materials for limiting temperature rise in building integrated photovoltaics", Solar Energy, vol. 80, 2006, pp. 1121-1130.

International Search Report Issued Mar. 9, 2012 in PCT/EP12/52219 Filed Feb. 9, 2012.

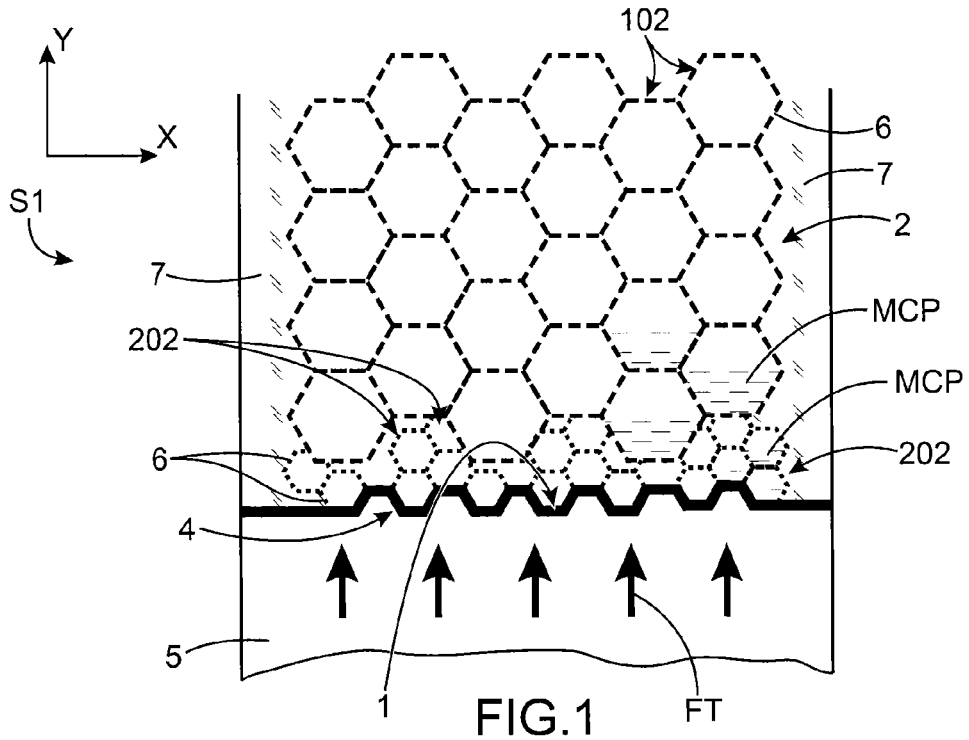
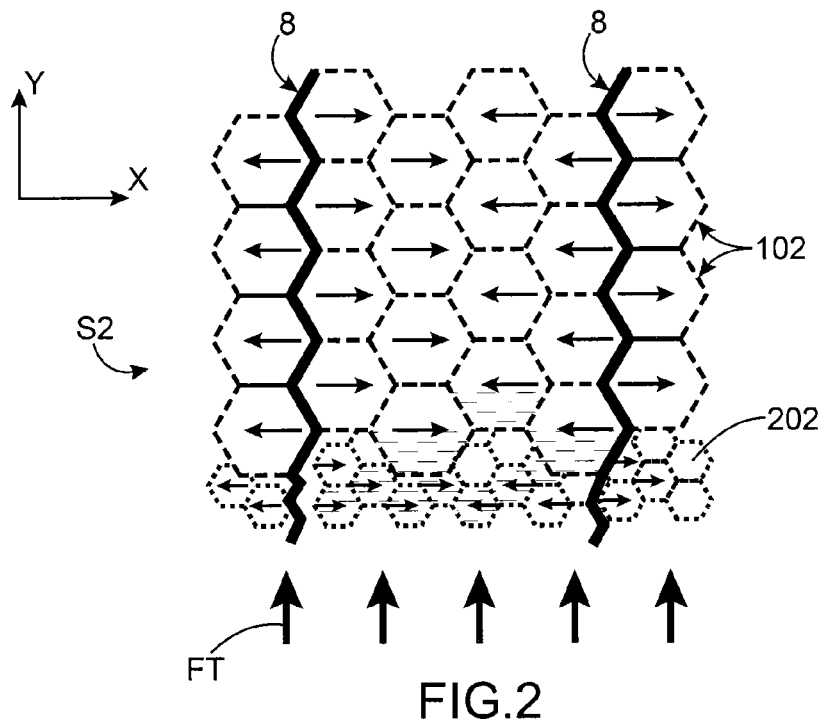

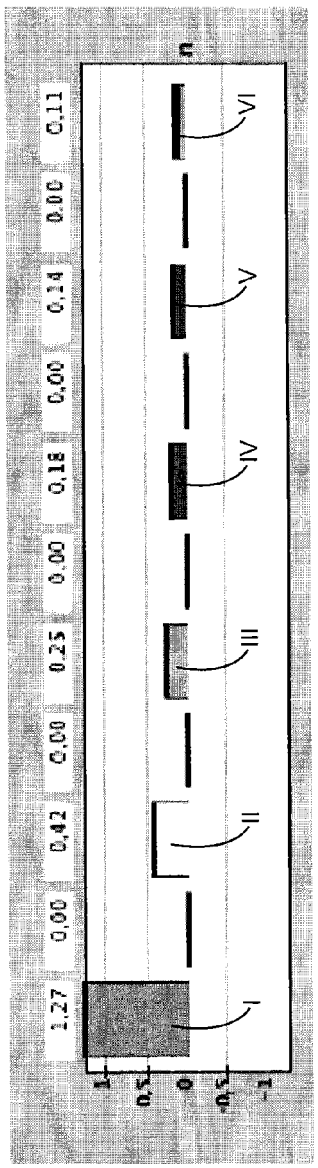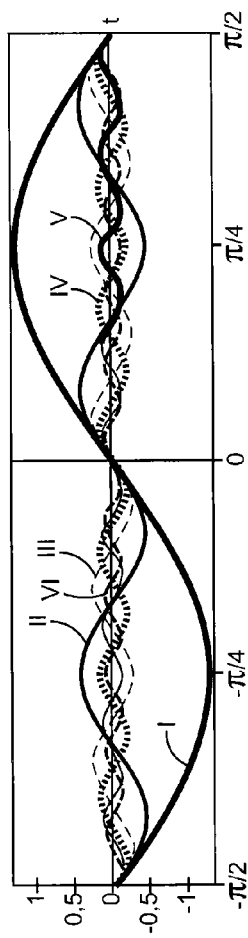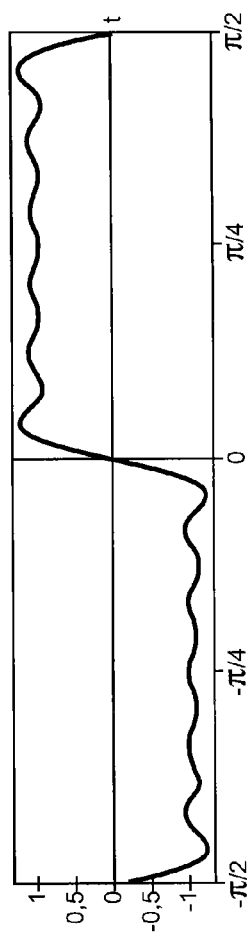

HEAT-ABSORBING DEVICE WITH PHASE-CHANGE MATERIAL

TECHNICAL FIELD AND PRIOR ART

The present invention relates to a heat absorbing device with phase-change material, particularly adapted to the absorption of the heat emitted by systems in the field of electronics, microelectronics and power electronics.

Electronic components are sources of multiple emissions of thermal fluxes, these being able to be alternatively transitory and/or stationary depending on their state of operation. In certain cases of uncontrolled operation, the consequence of these thermal fluxes may lead to an instantaneous and momentary positive temperature difference compared to their nominal operating temperature. In certain cases, this temperature difference may lead to damaging or loss of efficiency of the component.

Consequently, in order to ensure the correct operation of electronic components, a planned evacuation of the heat is required.

The thermal fluxes have variable peaks of amplitudes and periods and different appearance frequencies during the operation of the electronic system, as a function of its use.

Radiator type devices exist which make it possible to evacuate continuously the heat emitted by the components, however they are not always capable of reacting when a random thermal flux is emitted. Circuits for circulating coolant in contact with one face of the component also exist for extracting the heat by heat exchange. These circuits are bulky and require means to circulate the fluid. Moreover, as previously, they are not always capable of absorbing a quantity of heat emitted randomly. Or it is then necessary to over-dimension the circuit to be able to absorb these thermal flux emission peaks.

Moreover, these systems are not capable of responding at a speed (or frequency) greater than the speed of appearance of the temperature difference.

A system also exists implementing phase-change materials, such as paraffin, to absorb the heat emitted by a photovoltaic panel. The system is arranged on the face of the panel opposite to that receiving the solar radiation, and may comprise fins perpendicular to said face and a phase-change material arranged in the inter-fin spaces. The heat emitted by the panel is transmitted to the phase-change material; when the temperature of the panel is greater than the phase-change temperature of the material, it starts to melt by absorbing the heat emitted by the photovoltaic panel.

However, the quantity of heat absorbed is limited by the quantity of phase-change material found in contact with the panel.

In addition, since phase-change materials have poor thermal conductivity, forming systems having a large thickness of phase-change material cannot be envisaged.

Moreover, a large thickness of material does not offer a response speed adapted to temperature difference appearance speeds. In addition, in order to enable the system once again to absorb this heat, the heat accumulated by the phase-change material needs to be extracted. Yet, in the case of a large thickness of material, this extraction is not easy.

DESCRIPTION OF THE INVENTION

It is consequently an aim of the present invention to offer an optimised heat absorbing device being capable of absorbing thermal fluxes emitted by a heat source imposing multiple transitory conditions of operation, the transitory conditions being able to be simultaneous or staggered over time.

The aforementioned aim is attained by a device comprising a plurality of stacked cells containing a phase-change material, the structure comprising several sizes of cell, these sizes of cell being determined to absorb as best as possible the peaks according to their frequency of appearance, the number of cells being determined as a function of the relative amplitude of the peaks.

According to the invention, a plurality of cells is implemented, the size of which is a parameter for adjusting the kinetics of the change of phase. In fact the phase-change material contained in a larger cell melts completely over a longer time than that contained in a smaller cell. Consequently, for peaks having a short lifetime (high associated transitory regime frequency), cells of small size absorb the heat efficiently.

In other words, the system is formed as a function of the frequential characteristics of the thermal flux to be absorbed. It comprises a plurality of cells composed of a heat conductor and a phase-change material, each of the zones being particularly adapted to absorb thermal peaks of given frequency. Each size is chosen so as to respond as best as possible to the different frequencies of appearance of the thermal fluxes.

In a particularly advantageous manner, the structure also comprises favoured heat conduction paths extending in the direction of the heat flux so as to distribute in a uniform manner the heat within the structure and enable an absorption thereof by all of the cells. Thus it is possible to involve a large quantity of phase-change material over a certain thickness for extracting the heat, despite its low thermal conductivity.

The cells form a three-dimensional structure.

Preferably, the cells are interconnected, and their filling rate is less than unity which enables the phase-change material to expand when it melts.

In a very advantageous manner, channels for circulating a coolant are formed between the cells in order to extract the heat absorbed by each of the cells.

The subject-matter of the present invention is then a heat absorbing device comprising a structure having a plurality of individual cells, each cell being delimited by an envelope made of a material that has good thermal conductivity and contains at least one phase-change material, said structure comprising a first end surface intended to be in contact with a surface emitting a thermal flux to be absorbed, said thermal flux being composed of at least two thermal events of different amplitudes and different frequencies, said cells being stacked on top of one another from said end surface so that the structure extends at least in the direction of the thermal flux, the cells being in contact with each other by their envelope, said structure comprising at least one first size of cell and a second size of cell, the quantity of phase-change material in each cell being proportional to its size, wherein the first size of cell is determined as a function of the frequency of the first event and the second size of cell is determined as a function of the frequency of the second event and wherein the distribution between the number of cells of first size and the number of cells of second size is determined as a function of the amplitudes of the first and second events. The first size of cell and the second size of cell increase when the frequency of the first event and the frequency of the second event respectively reduce and the number of cells of first size and the number of cells of second size increase when the amplitude of the first event and the amplitude of the second event respectively increase.

Preferably, when the frequency of the second event is below that of the first event, the second size of cell is greater than the first size of cell, and the cells of first size are situated on the side of the first end surface.

Advantageously, the size of the cells increases in the direction of the thermal flux from the first end surface.

In a particularly interesting manner, the cells are interconnected so as to enable the passage of the phase-change materials from one cell to the next. The cells are then preferably interconnected in the direction of the thermal flux.

In a particularly advantageous embodiment, the heat absorbing device also comprises at least one favoured heat conduction path extending from the first end surface in the direction of the thermal flux between the cells. The heat absorbing device may comprise several favoured conduction paths distributed regularly in the structure.

For example, the at least one favoured conduction path is formed by a portion of heat conducting material situated between the cells and extending in the direction of the thermal flux. The portion of heat conducting material is preferably of the same material as that of the walls of the cells, for example made of copper or Maraging steel. The portion of heat conducting material and the envelopes of the cells in contact with said portion may be all in one piece.

The heat absorbing device may also comprise means for extracting the latent heat stored in the phase-change material. It may involve at least one channel between the cells, wherein circulates a coolant. Advantageously, the circulation of the coolant is controlled as a function of the occurrence of a thermal event.

The heat absorbing device preferentially comprises means for thermally insulating the lateral edges of the stacking.

For example, the at least one phase-change material implemented has a phase change temperature comprised between 50° C. and 350° C.

In a particular embodiment, the heat absorbing device comprises three sizes of cells of parallelepiped shape, the cells of each size being arranged in a layer, the cells being interconnected between each layer.

The subject-matter of the present invention is also a method of forming a heat absorbing device according to the present invention intended to absorb a periodic thermal flux emitted by a heat source, comprising the steps:

calculating from the function representative of said periodic thermal flux of a limited development of order n of periodic functions, for example sinusoidal, each corresponding to an individual heat source having a certain frequency, selecting the periodic functions, for example sinusoidal, of which the sum of the amplitudes is greater than a given percentage of the maximum amplitude of the thermal flux, the given percentage being for example comprised between 60 to 98%, determining the size of the cells as a function of the frequencies of the selected functions, the size of the cells increasing when the frequency of the selected functions decreases, determining the distribution of the number of cells of each size as a function of the amplitude of the selected functions, the number of cells of each size increasing when the amplitude of the selected functions increases, forming a device provided with cells of which the size and the number correspond to those determined during the two preceding steps.

BRIEF DESCRIPTION OF DRAWINGS

The present invention will be better understood by means of the description that follows and the appended drawings in which:

FIG. 1 is a schematic sectional view of an embodiment example of a heat absorbing structure, FIG. 2 is another embodiment example of a heat absorbing structure, FIG. 6A is a graphic representation of a function representative of an example of a thermal flux, FIG. 6B is a graphic representation of the limited development in 11 sinusoidal functions of the function of FIG. 6A, FIG. 6C is a graphic representation of the amplitudes of the sinusoidal functions of FIG. 6B.

DETAILED DESCRIPTION OF PARTICULAR EMBODIMENTS

Figure 3:
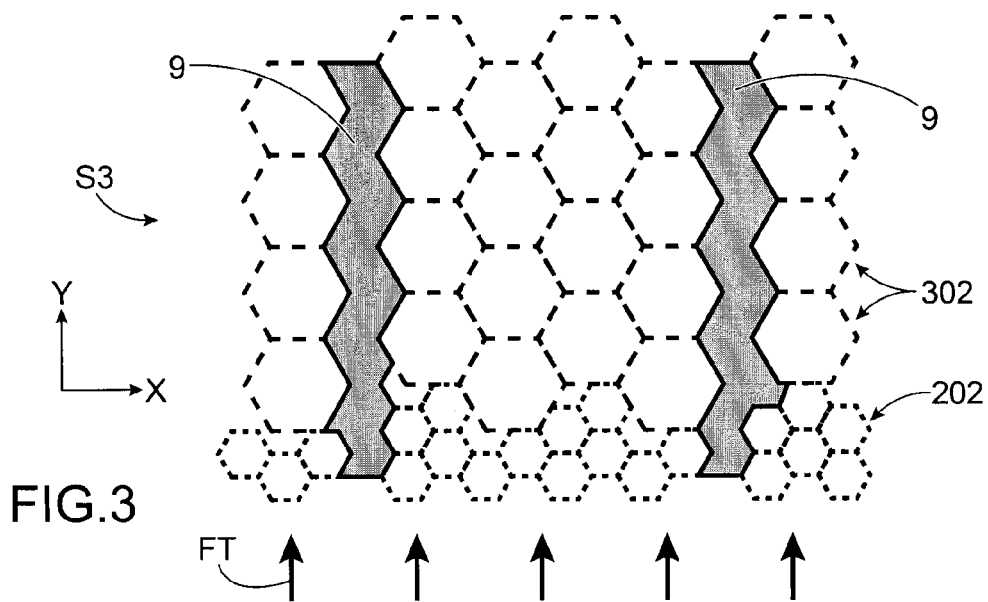
FIG. 3 is another embodiment example of a heat absorbing structure.

In FIG. 1 may be seen an example of forming a heat absorbing structure S1 according to the present invention.

The structure S1 comprises an end surface 1 intended to be in contact with a surface 4 of a system from which it is desired to extract heat. For example, this system is an electronic component.

In the present invention, the phase-change materials will be designated hereafter by PCM. Phase-change material is taken to mean a thermal phase-change material, i.e. capable of changing physical state at a given temperature. For example, the PCM melts and passes from the solid state to the liquid state or from the liquid state to the gaseous state when, its temperature increasing, it reaches the melting or evaporation temperature of the material, and solidifies or liquefies when, its temperature decreasing, it reaches the solidification or condensation temperature of the material.

Preferably, the phase-change temperatures of the PCM implemented are comprised between 50° C. and 350° C., which enables an application of the absorption structure to the field of microelectronics, electronics and power electronics.

The phase-change materials corresponding to this interval may be organic, for example commercially available paraffin, salt hydrates, such as magnesium nitrate hexahydrate, sodium hydroxide monohydrate, $MgCl_2*6H_2O$, salts such as $LiNO_3$, $NaNO_3$, $KNO_3$, $NaNO_3$—$KNO_3$.

The structure S1 comprises a plurality of cells 2 in contact with each other. Each cell 2 comprises an envelope 6 and a PCM (represented schematically) arranged in the envelope 6. The envelope is made of a heat conducting material, preferably made of a metal material such as copper and Maragine steel which offer good thermal conductivities. Good thermal conductivity is taken to mean, in the present invention, a thermal conductivity greater than 1 W/K/m, preferably greater than 50 W/K/m, more preferably greater than 100 W/K/m.

In the example represented, each cell 2 has the shape of a hexahedron so that the structure is of the honeycomb type. This shape is in no case limiting, for example cylindrical cells with circular or any section, parallelepiped cells or any other polyhedral shape could be envisaged.

The envelopes may be closed in a sealed manner, in this case it is provided that the interior volume of the cell is sufficient to accommodate the volume variations of the PCM during phase changes.

The envelopes may be advantageously open, as is represented in a schematic manner by the dotted lines of the envelopes in FIG. 1. The cells being interconnected, the PCM may then pass from one cell to the neighbouring cells, which ensures the accommodation of the variation in volume. The fact of having open cells is also advantageous for the filling of the envelope with the PCM. A structure in which the cells would be interconnected by group and not all together does not go beyond the scope of the present invention.

Preferably, the cells are interconnected in the direction of the thermal flux.

Preferably, the structure is formed all in one piece, the lateral walls of two adjacent cells being common. The structure also comprises front and rear walls (not represented) to close the cells in the representation of FIG. 1 formed for example by added plates. The structure S1 is then such that it forms a sealed assembly.

In the structure S1, the cells 2 form a two-dimensional structure extending substantially along an X axis along the surface 4 of the system and along a Y axis orthogonal to the X axis.

The cells are then arranged substantially in the form of lines stacked on top of one another. In a three-dimensional structure, the cells are distributed substantially in layers.

The surface 4 emits a thermal flux symbolised by the arrow designated FT in the direction of the Y axis, it is this flux FT that the structure S1 is intended to absorb.

Preferably, the structure S1 comprises lateral thermal insulation means 7 in order to guide the thermal flux along the Y axis. The thermal insulation means 5 are, for example, formed by a heat insulating material added onto the exterior lateral faces of the structure or by empty zones.

As may be seen in FIG. 1, the structure S2 comprises cells of two different sizes, cells 102 having a first size and cells 202 having a second size. The first size is greater than the second size.

"Size" is taken to mean the volume of the cell. Furthermore, the quantity of PCM contained in a cell is proportional to its size. Thus a cell of large size contains more PCM than a cell of small size. Thus in the remainder of the description, the expressions "size of cell" and "quantity of PCM" or "volume of PCM" will be used invariably.

Preferably, the volume of PCM in the liquid state (dilated state, in the case of a solid-liquid change of phase), is as close as possible to the volume of the cell in order to optimise the filling of the system and thus its efficiency. Preferably, the PCM in the solid state thus fills from 80% to 95% of the cell, taking account of the solid-liquid expansion rate, which is typically comprised between 5% and 20%.

In the example represented and in a preferred manner, the cells of small size 202 are situated on the side of the heat emitting surface 4 and the cells of large size 102 are situated as far as possible from this surface stacked on the cells 202.

This configuration is advantageous because, on the one hand the cells of small size are adapted to the absorption of peaks of high frequency because the PCM contained in small quantity in each cell melts more rapidly. Moreover, the heat emitted by the peaks of high frequency penetrates "less deeply" into the structure since they are of shorter duration. It is thus preferable that the small cells are situated as close as possible to the surface 4.

The operation of the structure S1 will now be explained.

The surface 4 emits a thermal flux that the structure S1 has to absorb. The heat is going to circulate in the envelopes 6 of the cells 2 in direct contact with the emitting surface 4 and is going to diffuse throughout the entire structure through the intermediary of the material of the envelopes which has good, or even very good thermal conductivity, and also via the PCM. Due to the rise in temperature, the PCM contained in the cells changes phase, passing either from the solid state to the liquid state, or from the liquid state to the gaseous state. This change of phase absorbs the thermal energy that is stored in the form of latent heat in each of the cells.

The heat absorbed is then evacuated, i.e. the structure is cooled to make the device once again able to absorb a new thermal flux. By this cooling, the PCM changes phase once again and passes from the liquid state to the solid state or from the gaseous state to the liquid state. For example, this cooling is obtained by circulating a coolant, liquid or gaseous, in or around the structure.

Furthermore, the heat emitted by the peaks of high frequency, i.e. which is emitted during a short duration, is absorbed by the small cells, the PCM that they contain, which is found therein in small volume, melts rapidly. The storage of the heat in the form of latent heat takes place rapidly. The heat is thus absorbed rapidly.

When the peaks have a low frequency, i.e. they emit heat over a long period, the cells of large size containing a certain quantity of PCM melt less rapidly and store this heat in the form of latent heat.

The structure may comprise more than two sizes of cells as a function of the flux and the different frequencies of the heat emitting events.

In FIG. 2 may be seen another embodiment example of a heat absorbing structure S2.

The structure S2 comprises, like the structure S1, different sizes of cells.

It comprises, moreover, in a particularly advantageous manner, at least one favoured thermal conduction path 8 in order to further improve the distribution of the heat to be absorbed within the structure S2.

The favoured thermal conduction paths 8 through which the thermal flux FT circulates preferentially are oriented substantially in the direction of the flux FT. The paths 8 are formed by zones made of a heat conducting material, the thickness of which is greater than that of the envelopes so as to favour the passage of the thermal flux via these zones. Preferably, it is the same material as that forming the envelopes so as to ensure a uniform thermal conductivity. Another material having a thermal conductivity close to that of the envelopes could be chosen.

The paths 8 may be formed either directly by the envelopes, these then comprise a portion of greater thickness, or by elements inserted between the envelopes, their shape being chosen to ensure an intimate contact with the envelopes.

The operation of the structure S1 will now be explained. It is recalled that PCM offer a low thermal conductivity, very much less than the material of the envelopes.

The surface 4 emits a thermal flux that the structure S2 has to absorb. The thermal energy circulates in the envelopes of the cells 2 in direct contact with the surface 4. In addition, the heat preferentially follows the paths 8. This heat is then distributed laterally in the cells as is symbolised by the arrows. The energy to be absorbed is then supplied as close as possible to the cells and in a substantially homogeneous manner.

Thus all of the cells participate in a uniform manner in the absorption of the thermal energy.

Due to the rise in temperature, the PCM contained in the cells changes phase, passing either from the solid state to the liquid state, or from the liquid state to the gaseous state. This change of phase absorbs the thermal energy that is stored in the form of latent heat in each of the cells.

The heat absorbed is then evacuated, i.e. the structure is cooled so that the PCM changes phase once again and passes from the liquid state to the solid state or from the gaseous state to the liquid state. For example, this cooling is obtained by circulating a coolant, liquid or gaseous, around the structure.

A large number of stacked cells may thus be used and thus increase the heat storage quantity, without the low thermal conductivity of PCM being disadvantageous and causing the appearance of a sharp thermal gradient within the structure S2.

For example, the size of the cells is comprised between 1 μm and 1 cm. The thickness of the envelope represents from 1% to 20% of the size of the cell. The thickness of the path represents from 20% to 100% of the size of the cell. In the case where the thickness of the favoured conduction path represents 100% of the size of the cell, the location of a line of cells is used to create a conduction path.

Heat paths 8 are distributed in the structure as a function of the quantity of heat to be absorbed. Preferably, they are distributed in a regular manner so as to ensure a distribution as homogeneous as possible of the heat within the structure.

In FIG. 3 may be seen another embodiment example of a heat absorbing structure S3 integrating means for extracting the heat absorbed by the PCM. The structure is similar to that of FIG. 1, and comprises in addition channels 9 for circulating a coolant.

In the example represented, the channels 9 extend between cells substantially parallel to the X axis. However this embodiment is in no case limiting. In a variant, the channels 9 could be oriented orthogonally to the X and Y axes.

In the example represented, the channels 9 are formed by a clearance between the cells. In a variant, these channels 9 could be formed by eliminating the cells.

The circulation of the coolant in the channels 9 can take place either in a continuous manner, or as a function of the destocking needs following the detection of a heat peak. For example, water or oil is used as coolant.

The coolant after having circulated in the channels 9 exchanges its heat with the exterior environment for example.

Figure 4:
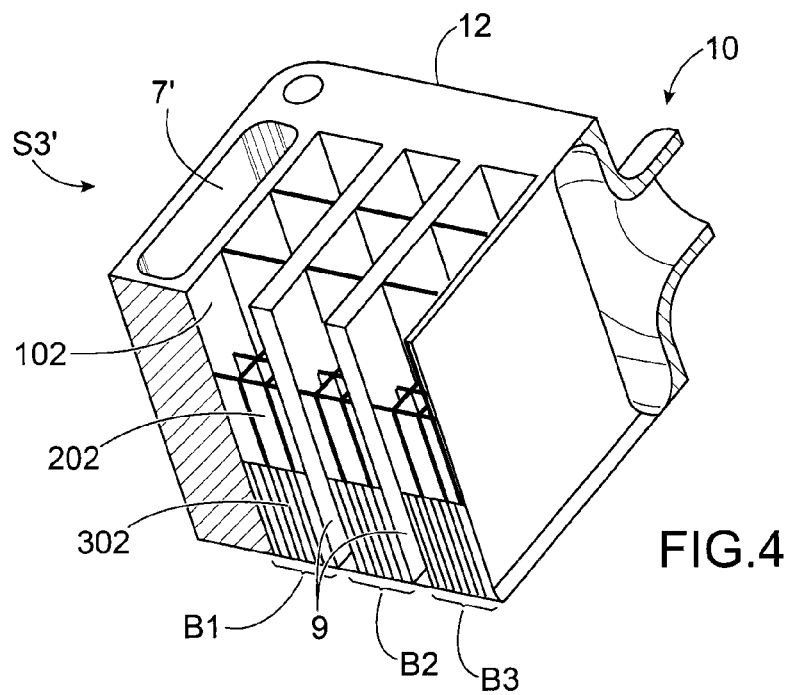
FIG. 4 is a perspective view of a practical embodiment example of the structure of FIG. 3.

In FIG. 4 may be seen a quarter view in section of a practical embodiment example of a heat exchange structure S3' similar to the structure S3.

For example, the structure S3' of FIG. 4 is formed by laser fusion.

This structure comprises a casing 12 wherein interconnected cells of three different sizes 102, 202, 302 are formed. The cells have the shape of parallelepiped rectangles, their lengths being substantially parallel. As may be seen, the cells 102, 202, 302 are distributed by layer as a function of their size. By considering that the end surface 1 is located at the bottom in the representation of FIG. 4, the cells of smaller size 302 are on the side of the end surface 1, then the cells of intermediate size 202 are situated on the cells of smallest size and finally the cells of large size 102 are situated on the cells of intermediate size 202.

As represented, the structure is oriented so that the thermal fluxes FT apply preferentially on the side of the cells of small size 302.

The channels for circulating a coolant extend between blocks of cells B1, B2, B3 and are supplied in parallel by a rear connector 10. Moreover, the walls of the channels 9 form favoured heat conduction paths 8 within the structure S3', which are prolonged by the walls of the cells 102, 202, 302.

Laterally, the structure S3' is thermally insulated by hollowings 7' extending over the whole height of the structure.

The filling of the cells with the PCM takes place for example by the cells of large size 102, the PCM pouring into the cells of intermediate size 202 and of small size 302. A cover (not represented) is then fixed on the casing to close in a sealed manner the cells.

For example, the smallest cells 302 have a side section of length 0.4 mm, the cells of intermediate size 202 have a side section of length 1.5 mm and the cells of large size 302 have a side section of length 5 mm. The volume of PCM is 0.08 mm³ to 0.096 mm³ for the smallest cells 302; from 4.24 mm³ to 5 mm³ for the cells of intermediate size 202 and from 157 mm³ to 186 mm³ for the cells of large size 302.

In the case where the cells are cylinders, the channels could be delimited directly by the spaces left free between the cells.

As a numerical example uniquely, the dimensions of the cells and the favoured conduction paths for several PCM and heat conducting materials will now be calculated.

The transfer of the heat from the exterior of the structure to the PCM takes place along two routes: a first route at the scale of a cell, between the envelope of the cell and the PCM, and a second route at the scale of the structure in the favoured conduction paths.

At the scale of the cell, the kinetics of the transport of heat then depends on the temperature conditions on the envelope of the cell and the physical properties of the PCM.

The position of the phase change front designated s(t) may be modelled by the following equation:

$$s(t) = \sqrt{2 \cdot \frac{\lambda \Delta T}{L} \cdot t} \tag{i}$$

where s(t) is the position of the phase change front (or depth of thermal penetration) at time t, λ is the thermal conductivity of the PCM (W/k·m), ΔT is the temperature difference between the envelope and the PCM material undergoing transformation, L is the latent heat of change of phase of the PCM (J/m³).

It is thus possible to define, for a given PCM material, a time (or frequency) and space (volume of the cell) domain wherein the change of phase is complete and, consequently, the heat storage is optimal.

The calculation has been carried out for four different PCM of salt and salt compound type, the physical properties of which are grouped together in table T1 below.

TABLE T1

| PCM | T (° C.) | KJ/cm³ | Thermal conductivity (W/K/m) |
| --- | --- | --- | --- |
| LiNO₃ | 250 | 0.6 | 1.38 |
| NaNO₃ | 305 | 0.3 | 0.8 |
| KN0₃ | 340 | 0.2 | 0.9 |
| NanO3—KNO₃ | 222 | 0.2 | 0.8 |

The second column gives the solid/liquid phase change temperature.

Figure 5:
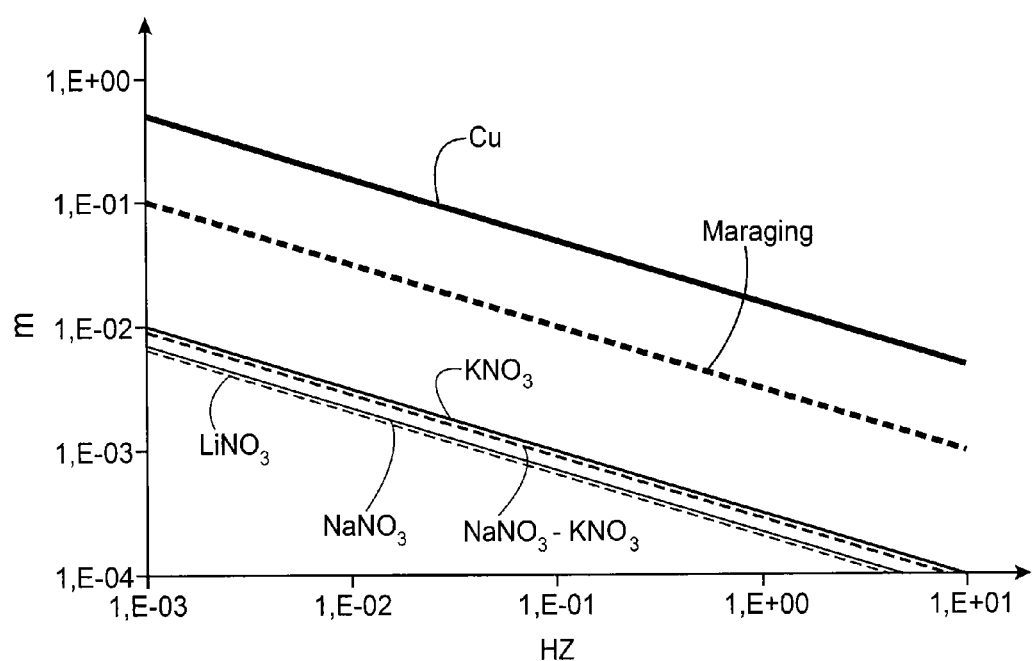
FIG. 5 is a graphic representation of the variation of the depth of thermal penetration for different phase-change materials and for different envelope materials as a function of the frequency of the thermal fluxes.

In FIG. 5 may be seen the variation of the depth of thermal penetration in meters for the PCM above as a function of the frequency of the thermal flux in Hz. For the calculations, ΔT was chosen equal to 10° C.

In table T2 below are grouped together the values of the position of the phase change front for the different PCM.

TABLE T2

|  | LiNO$_3$ | NaNO$_3$ | KNO$_3$ | NaNO$_3$_KNO$_3$ |
|---|---|---|---|---|
| s(0.01 Hz) in mm | 2.1 | 2.2 | 3.2 | 2.8 |
| S(0.1 Hz) in mm | 0.7 | 0.7 | 1.0 | 0.9 |

For a thermal stress of 100 seconds (0.01 Hz), the storage in a PCM of NaNO$_3$—KNO$_3$ type will be optimal if the cell dimension is of the order of 2.8 mm.

The dimension of which it is question here is the dimension along the X axis, since the heat is distributed along the X axis as schematised in FIGS. 1 and 2. In the case of a cell of square section, as in FIG. 4, it is the dimension on the side of the square.

For a thermal stress of 10 seconds (0.1 Hz), the storage in a PCM of NaNO$_3$—KNO$_3$ type will be optimal if the cell dimension is of the order of 0.9 mm.

Consequently, thanks to the invention, the size of the different cells can be dimensioned as a function of the multiple transitory conditions of operation of the heat source, the transitory conditions being able to be simultaneous or staggered over time.

The optimal length of the favoured conduction paths will now be calculated. At the scale of the structure, the thermal path of transport of the heat is that of the conduction of the heat in the material of the favoured conduction paths which is preferably that of the envelopes of the cells. The kinetics of the transport then depend on the incident flow of heat, the architecture and the physical properties of the conducting material. Statistically, an average depth of thermal penetration may be defined as follows:

$$\delta(\omega) = \sqrt{\frac{2D}{\omega}} \quad \text{(ii)}$$

with
D: the thermal diffusivity of the material in m$^2$/s
ω: the frequency of the thermal signal.

The examples of copper and Maraging steel will be taken to form the favoured conduction paths, the physical properties of which are grouped together in table T3 below.

TABLE 3

| Conductor | Diffusivity (m$^2$/s) |
|---|---|
| Maraging | 4.90 · 10$^{-6}$ |
| Copper | 1.20 · 10$^{-6}$ |

In FIG. 5 may be seen the thermal penetration in the envelope material as a function of the frequency.

In table T4 below are grouped together the values of the position of the thermal penetration front for Maraging steel and copper.

TABLE T4

|  | Maraging | Copper |
|---|---|---|
| δ(0.01 Hz) in mm | 31.3 | 153.5 |
| δ(0.1 Hz) in mm | 9.9 | 48.5 |

For a thermal stress of 100 seconds (0.01 Hz), the penetration depths of the heat in the Maraging steel and in the copper are, respectively, of the order of 9.9 and 48.5 mm.

For a thermal stress of 10 seconds (0.1 Hz), the penetration depths of the heat in the Maraging steel and the copper are, respectively, of the order of 31.3 mm and 153.5 mm.

Consequently, in order to obtain maximum storage efficiency, the length of the favoured heat conduction paths, and thus substantially the height of the storage device, are chosen below these values.

Preferably, the width of the favoured heat conduction paths is comprised between the thickness of the envelope and the width of a cell.

The method of determining the different sizes of cells and their percentage in a heat absorbing structure as a function of the signal of a given thermal flux will now be described.

A heat source in square function of period T as represented in FIG. 6A will now be considered.

During a first step, this is represented by a limited development of order n of sinusoidal functions, each corresponding to an individual heat source of frequency n/T. FIG. 6B proposes a limited development of order 11 of this function. The sinusoidal functions may be seen, the amplitude of which is the greatest designated by I to VI, each representative of a periodic thermal event of the heat source.

In FIG. 6C may be seen the thermal amplitude of each of these signals.

During a following step, the signals having the highest amplitudes are selected. For example, the signals having the frequencies f1, f3 and f5 are selected, the other signals having very low amplitudes.

Advantageously, the signals are selected of which the sum of the amplitudes represents between 60% to 98% of the maximum amplitude of the thermal flux.

Knowing the frequencies f1, f3 and f5, it is possible to determine the size of the cells as explained previously from equation (i) and as a function of the ratio between the amplitude of the signals and the total amplitude, the fraction of cells of each size is determined.

A structure having three different sizes of cells is then obtained. In table T5 are grouped together the dimensions of the cells and their distribution. The size of the cells has been considered by considering NaNO3-KNO3 as PCM.

TABLE T5

| | m$_1$ | | | | m$_3$ | | | | m$_5$ | | | |
|---|---|---|---|---|---|---|---|---|---|---|---|---|
| Source | Amplitude | Frequen | Siz | % | Amplitude | Frequen | Siz | % | Amplitude | Frequen | Siz | % |
| T/2 = 100 secondes | 1.27 | 0.005 Hz | 4.0 mm | 65% | 0.42 | 0.015 Hz | 2.3 mm | 22% | 0.25 | 0.025 Hz | 1.8 mm | 13% |
| T/2 = 10 secondes | 1.27 | 0.050 Hz | 1.3 mm | 65% | 0.42 | 0.150 Hz | 0.7 mm | 22% | 0.25 | 0.250 Hz | 0.6 mm | 13% |

Figure 7C:
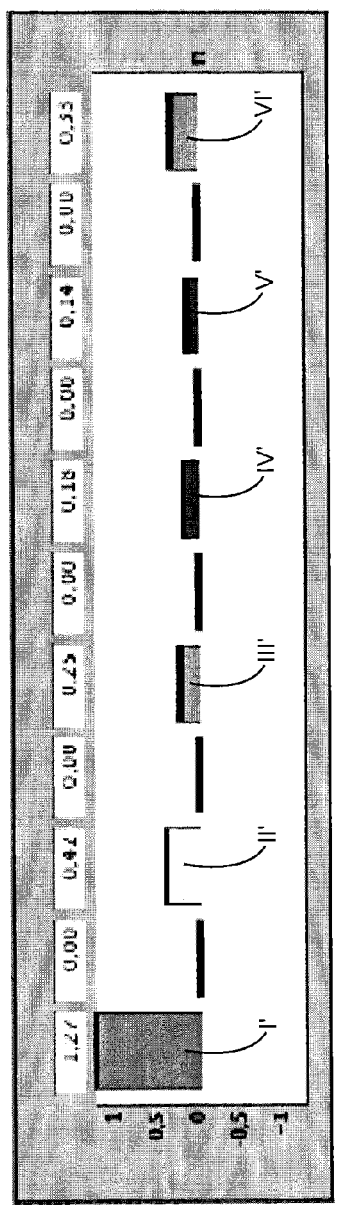
FIG. 7C is a graphic representation of the amplitudes of the sinusoidal functions of FIG. 7B, FIGS. 8A and 8B are graphic representations, at different time scales, of signals representative of a thermal flux to which the structure of FIG. 4 is particularly adapted.
Figure 7B:
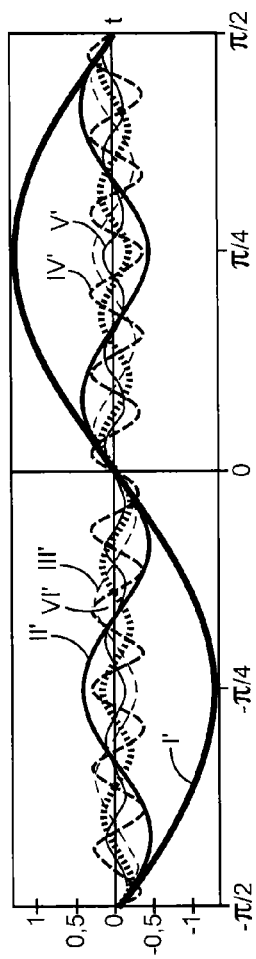
FIG. 7B is a graphic representation of the limited development in 11 sinusoidal functions of the function of FIG. 7A.
Figure 7A:
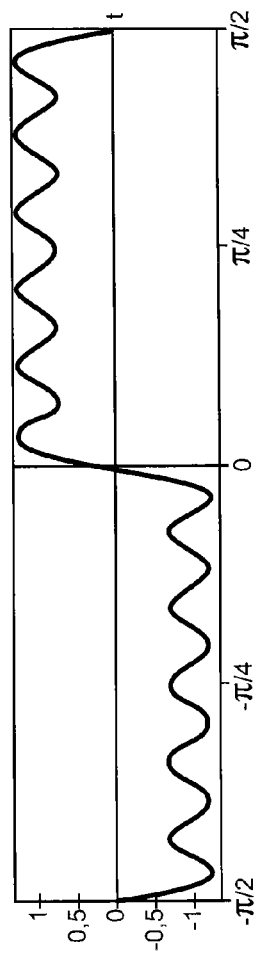
FIG. 7A is a graphic representation of another function representative of an example of a thermal flux.

In FIGS. 7A to 7C may be seen another example of development of a square function representative of a heat source, the sinusoidal functions of which the amplitude is the greatest are designated by I' to VI'. In this case, the amplitude of the signal of the 11th order, marked by VI', is 33. The structure may then be formed with four sizes of cells or then the signal of the $5^{th}$ order, marked by V', is no longer taken into account.

Figure 8A:
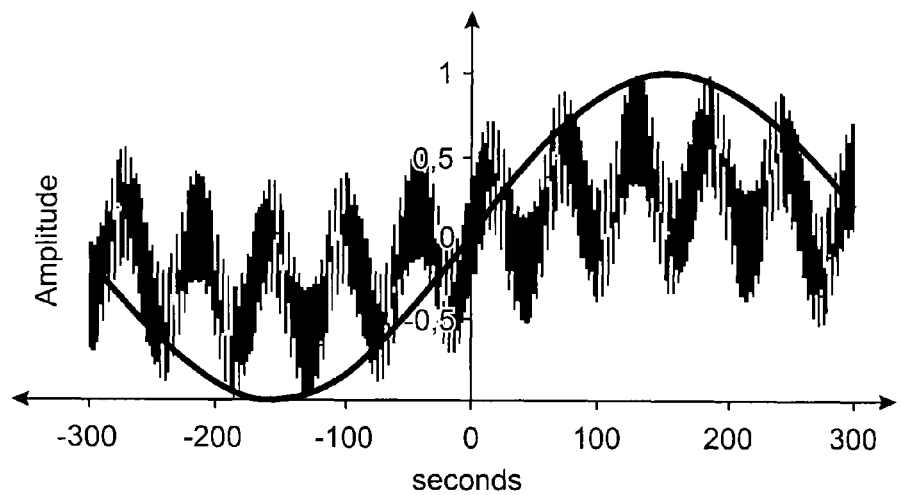
Figure 8B:
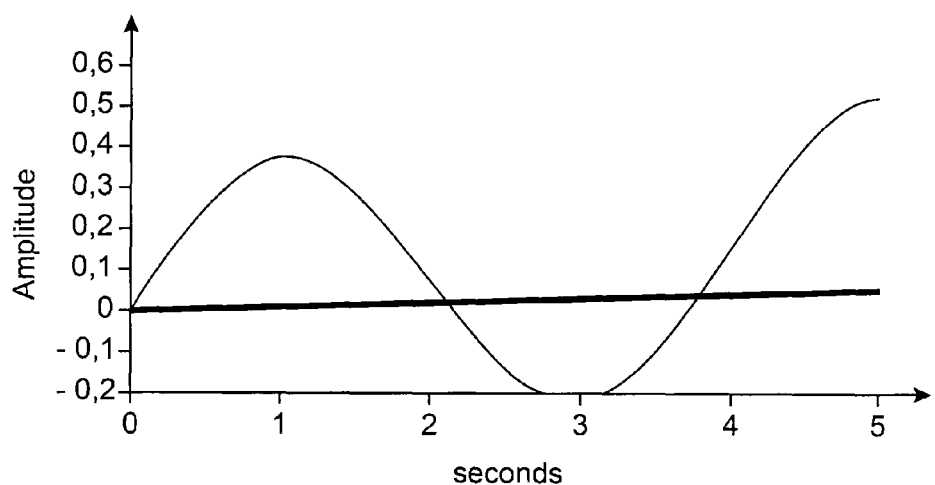

In FIGS. 8A and 8B may be seen the signals of the signals representative of a thermal flux to which the structure of FIG. 4 is particularly adapted, only the time scales vary between the two graphic representations.

In FIG. 4, the three sizes of cells have the same volume fraction, i.e. 33%.

In table T6 below are grouped together the sizes of cell as a function of the frequencies.

TABLE T6

| | $m_1$ | | | | $m_2$ | | | | $m_3$ | | |
|---|---|---|---|---|---|---|---|---|---|---|---|
| Amplitude | Frequen | Siz | % | Amplitude | Frequen | Siz | % | Amplitude | Frequen | Siz | % |
| 1 | 0.003 Hz | 5.0 mm | 33% | 1 | 0.035 Hz | 1.5 mm | 33% | 1 | 0.500 Hz | 0.4 mm | 33% |

After having determined the number and the size of the cells, it is possible to manufacture a heat absorbing device according to the invention.

It may be envisaged to have different PCM in the structure, for example as a function of the size and/or the position of the cells with respect to the heat source.

The invention thus offers a heat absorbing device particularly adapted to systems having multiple operating conditions, in particular to systems of the field of electronics, microelectronics and power electronics in which the thermal fluxes depend on the operation of the components. Moreover, the absorption device according to the invention may be formed specifically as a function of the profile of the thermal flux of each system.

The invention claimed is:

1. A heat absorbing device comprising a structure comprising:
    a plurality of individual cells, each cell being delimited by an envelope made of a material that has good thermal conductivity and includes at least one phase-change material;
    a first end surface configured to be in contact with a surface emitting a thermal flux to be absorbed, the thermal flux being made up of at least two thermal events of different amplitudes and different frequencies, the cells being stacked on top of one another from the first end surface so that the structure extends at least in a direction of the thermal flux, the cells being in contact with each other by their envelope;
    at least one first size of cell and one second size of cell, a quantity of phase-change material in each cell being proportional to its size;
    wherein the first size of cell is determined as a function of frequency of the first event and the second size of cell is determined as a function of frequency of the second event;
    wherein a distribution between a number of cells of first size and a number of cells of second size is determined as a function of amplitudes of the first and second events; and
    wherein the first size of cell and the second size of cell increase when the frequency of the first event and the frequency of the second event respectively reduce, and wherein the number of cells of first size and the number of cells of second size increase when the amplitude of the first event and the amplitude of the second event respectively increase.

2. A heat absorbing device according to claim 1, wherein the frequency of the second event is less than that of the first event, the second size of cell is greater than the first size of cell, and wherein the cells of first size are situated on a side of the first end surface.

3. A heat absorbing device according to claim 1, wherein the size of the cells increases in the direction of the thermal flux from the first end surface.

4. A heat absorbing device according to claim 1, wherein the cells are interconnected to enable passage of the materials with change of phase from one cell to a next.

5. A heat absorbing device according to claim 4, wherein the cells are interconnected in the direction of the thermal flux.

6. A heat absorbing device according to claim 1, comprising at least one favoured heat conduction path extending from the first end surface in the direction of the thermal flux between the cells.

7. A heat absorbing device according to claim 6, comprising plural favoured conduction paths distributed regularly in the structure.

8. A heat absorbing device according to claim 6, wherein a size of the at least one favoured conduction path represents from 20% to 100% of the size of the cell.

9. A heat absorbing device according to claim 6, wherein the at least one favoured conduction path is formed by a portion of heat conducting material situated between the cells and extending in the direction of the thermal flux.

10. A heat absorbing device according to claim 9, wherein the portion of heat conducting material is of a same material as that of walls of the cells.

11. A heat absorbing device according to claim 10, wherein the portion of heat conducting material and the envelopes of the cells in contact with the portion are all in one piece.

12. A heat absorbing device according to claim 1, further comprising an extracting device of latent heat stored in the phase-change material.

13. A heat absorbing device according to claim 12, wherein the extracting device comprises at least one channel between the cells in which a coolant circulates.

14. A heat absorbing device according to claim 13, wherein circulation of the coolant is controlled as a function of occurrence of a thermal event.

15. A heat absorbing device according to claim 1, further comprising a thermal insulator for insulating lateral edges of stacked cells.

16. A heat absorbing device according to claim 1, the at least one phase-change material implemented having a phase change temperature between 50° C. and 350° C.

17. A heat absorbing device according to claim 1, comprising three sizes of cells of parallelepiped shape, the cells of each size being arranged in a layer, the cells being interconnected between each layer.

18. A method of forming a heat absorbing device according to claim 1 configured to absorb a thermal flux of period emitted by a heat source, comprising:
- a) calculating from a function representative of the thermal flux of period of a limited development of order n of periodic functions, each corresponding to an individual heat source of frequency;
- b) selecting periodic functions of which the sum of the amplitudes is greater than a given percentage of the maximum amplitude of the thermal flux;
- c) determining the size of the cells as a function of the frequencies of the selected functions, the size of the cells increasing when the frequency of the selected functions decreases;
- d) determining the distribution of the number of cells of each size as a function of the amplitude of the selected functions, the number of cells of each size increasing when the amplitude of the selected functions increases;
- e) forming a device provided with cells of which the size and the number correspond to those determined during c) and d).

19. A method according to claim 18, the given percentage being between 60% to 98%.

* * * * *